(12) United States Patent
Huynh et al.

(10) Patent No.: US 7,927,454 B2
(45) Date of Patent: Apr. 19, 2011

(54) METHOD OF PATTERNING A SUBSTRATE

(75) Inventors: Khanh T. Huynh, Eagan, MN (US); Thomas A. Isberg, Minneapolis, MN (US); Matthew S. Stay, Minneapolis, MN (US); William A. Tolbert, Woodbury, MN (US); Martin B. Wolk, Woodbury, MN (US); Joseph W. Woody, Woodbury, MN (US); Robin E. Wright, Inver Grove Heights, MN (US); Haiyan Zhang, Woodbury, MN (US)

(73) Assignee: Samsung Mobile Display Co., Ltd., Yongin (KR)

( * ) Notice: Subject to any disclaimer, the term of this patent is extended or adjusted under 35 U.S.C. 154(b) by 933 days.

(21) Appl. No.: 11/778,732

(22) Filed: Jul. 17, 2007

(65) Prior Publication Data

US 2009/0023587 A1 Jan. 22, 2009

(51) Int. Cl.
*B44C 1/16* (2006.01)
*B29C 65/16* (2006.01)
*B32B 37/02* (2006.01)
*B32B 37/30* (2006.01)
*B32B 37/14* (2006.01)
*B32B 37/06* (2006.01)
*B32B 37/24* (2006.01)
*B32B 38/16* (2006.01)
*B44C 1/24* (2006.01)

(52) U.S. Cl. .................. 156/308.4; 156/234; 156/272.8; 156/273.3; 156/290

(58) Field of Classification Search .................. 156/290, 156/272.8, 273.3, 308.4, 234
See application file for complete search history.

(56) References Cited

U.S. PATENT DOCUMENTS

| 4,252,671 A | 2/1981 | Smith |
| 4,722,583 A | 2/1988 | Stewart |
| 4,833,124 A | 5/1989 | Lum |
| 4,912,083 A | 3/1990 | Chapman |
| 4,940,640 A | 7/1990 | MacDiarmid |
| 4,942,141 A | 7/1990 | DeBoer |

(Continued)

FOREIGN PATENT DOCUMENTS

EP 321 923 6/1989

(Continued)

OTHER PUBLICATIONS

Applied Surface Science 96-98 (1996) 399-404, Decomposition Mechanisms of Thin Palladium Acetate Film with Excimer UV Radiation.

(Continued)

*Primary Examiner* — Philip C Tucker
*Assistant Examiner* — Sonya Mazumdar
(74) *Attorney, Agent, or Firm* — Christie, Parker & Hale, LLP

(57) ABSTRACT

A method of forming a metallic material on a receptor that includes the steps of: placing a donor element proximate a receptor, wherein the donor element includes a donor substrate and a thermal transfer layer, wherein the thermal transfer layer includes a catalytic material, and wherein the thermal transfer layer of the donor element is placed proximate the surface of the receptor; thermally transferring at least a portion of the thermal transfer layer from the donor element to the receptor; and electrolessly depositing a metallic material on the receptor by growth of the metallic material on the catalytic material.

14 Claims, 7 Drawing Sheets

U.S. PATENT DOCUMENTS

| | | | |
|---|---|---|---|
| 4,948,776 A | 8/1990 | Evans | |
| 4,948,778 A | 8/1990 | DeBoer | |
| 4,950,639 A | 8/1990 | DeBoer | |
| 4,952,552 A | 8/1990 | Chapman | |
| 4,985,321 A | 1/1991 | Chou | |
| 5,023,229 A | 6/1991 | Evans | |
| 5,024,990 A | 6/1991 | Chapman | |
| 5,084,299 A | 1/1992 | Hirsch et al. | |
| 5,089,362 A | 2/1992 | Chou | |
| 5,156,938 A | 10/1992 | Foley | |
| 5,166,024 A | 11/1992 | Bugner | |
| 5,256,506 A | 10/1993 | Ellis et al. | |
| 5,286,604 A | 2/1994 | Simmons | |
| 5,322,275 A | 6/1994 | Gardellini | |
| 5,322,751 A | 6/1994 | Chou | |
| 5,332,646 A * | 7/1994 | Wright et al. | 430/137.22 |
| 5,340,699 A | 8/1994 | Haley | |
| 5,351,617 A | 10/1994 | Williams | |
| 5,360,694 A | 11/1994 | Thien | |
| 5,401,607 A | 3/1995 | Takiff | |
| 5,691,098 A | 11/1997 | Busman | |
| 5,725,989 A | 3/1998 | Chang | |
| 5,747,217 A | 5/1998 | Zaklika | |
| 5,756,689 A | 5/1998 | Busman | |
| 6,030,550 A | 2/2000 | Angelopoulos | |
| 6,194,119 B1 | 2/2001 | Wolk | |
| 6,228,555 B1 | 5/2001 | Hoffend | |
| 6,284,425 B1 | 9/2001 | Staral | |
| 6,468,715 B2 | 10/2002 | Hoffend | |
| 6,521,324 B1 * | 2/2003 | Debe et al. | 156/235 |
| 6,586,153 B2 | 7/2003 | Wolk | |
| 6,866,979 B2 | 3/2005 | Chang | |
| 2003/0138555 A1 * | 7/2003 | Debe et al. | 427/152 |
| 2004/0224252 A1 | 11/2004 | Kondo et al. | |
| 2005/0022692 A1 | 2/2005 | Eu | |
| 2005/0153078 A1 | 7/2005 | Bentley | |
| 2006/0121316 A1 | 6/2006 | Tomka et al. | |

FOREIGN PATENT DOCUMENTS

| | | |
|---|---|---|
| EP | 568 993 | 10/1993 |
| JP | 9-255774 | 9/1997 |
| WO | WO 97/33193 | 9/1997 |
| WO | WO 2005/079126 | 8/2005 |

OTHER PUBLICATIONS

Applied Surface Science 109-110 (1997) 253-258, Excimer Laser-Induced Surface Activation of Alumina for Electroless Metal Deposition.

Applied Surface Science 54 (1992) 465-470, UV-Induced Decomposition of Absorbed Cu-acetylacetonate Films at Room Temperature for Electroless Metal Plating.

The Electrochemical Society, Inc., Modern Electroplating, Fourth Edition, Schlesigner et al.

American Electroplaters' Society, Electroplating, pp. 406-409.

Wolfgang Riedel, Electroless Nickel Plating, pp. 5-6 (1989).

LITI Electroless Search Summary, pp. 1-7.

Bellmann et al., Chem. Mater 10, pp. 1668-1678 (1998).

Bayerl et al., Macromol. Rapid Commun. 20, pp. 224-228 (1999).

Beilo, K.A. et al., J. Chem. Soc. Chem. Commun., 1993, 452-454 (1993).

Applied Surface Science 86 (1995) 202-207, New Approach of a Laser-Induced Forward Transfer for Deposition of Patterned Thin Metal Films.

* cited by examiner

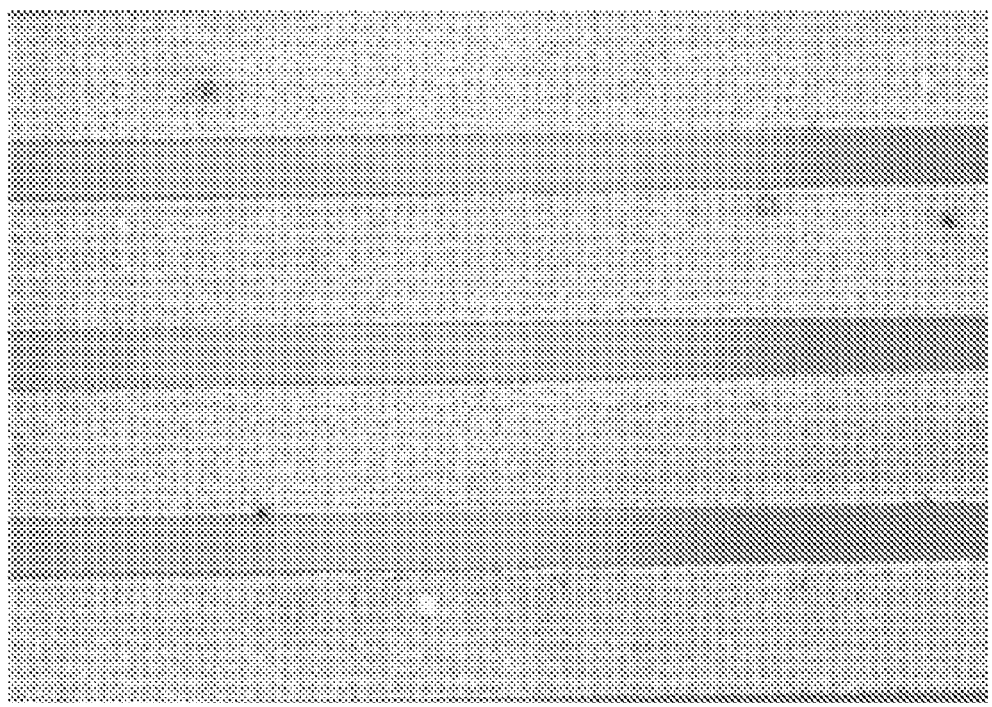
Fig. 7    199 μm

METHOD OF PATTERNING A SUBSTRATE

FIELD

This disclosure is related to the formation of a metallic material on a substrate.

BACKGROUND

Formation of small scale, high-resolution features is an ever moving target for the advancement of manufacturing processes. Conductive traces for printed wiring boards (PWBs) is an exemplary application for such processes. Electroless deposition is a plating method that is used for the fabrication of such features. The chemistry and process of electroless deposition has been established for quite some time, and is generally commercially available. There remains however, a need for advancements in selectively applying the catalytic material to the substrate that is eventually subjected to electroless deposition processes.

BRIEF SUMMARY

A method of forming a metallic material on a receptor that includes the steps of: placing a donor element proximate a receptor, wherein the donor element includes a donor substrate and a thermal transfer layer, wherein the thermal transfer layer includes a catalytic material, and wherein the thermal transfer layer of the donor element is placed proximate the surface of the receptor; thermally transferring at least a portion of the thermal transfer layer from the donor element to the receptor; and electrolessly depositing a metallic material on the receptor by growth of the metallic material on the catalytic material.

An article including, in the following order: a receptor substrate; a patterned first layer, wherein the first layer is capable of adhering to the receptor substrate; a patterned second layer including a catalytic material; and an electrolessly deposited metallic material, wherein the metallic material has the same pattern as the patterned first layer and the second patterned layer, wherein the patterned first layer and the patterned second layer are thermally transferred to the receptor substrate from a donor element and would be incompatible if originally formed on the receptor substrate in the order in which they are found on the receptor substrate.

A thermal transfer donor element including, in the following order: a donor substrate; a light-to-heat conversion layer; and a thermal transfer layer that includes a catalytic material.

BRIEF DESCRIPTION OF THE DRAWINGS

FIG. 7 illustrates a micrograph of a sample formed according to an embodiment of the present invention.

DETAILED DESCRIPTION

Figure 1A:
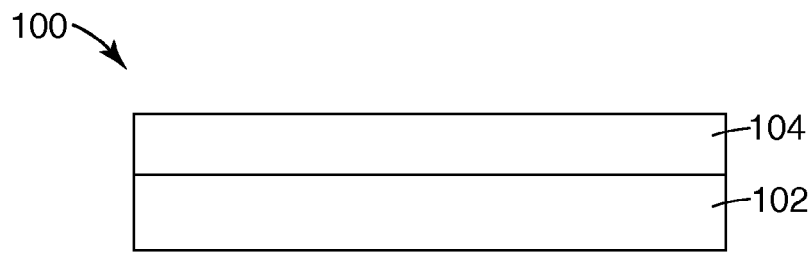
FIG. 1a is a schematic cross section of one example of a donor element as disclosed herein.

It is to be understood that embodiments beyond what are mentioned here are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Disclosed herein is a method of forming a metallic material on a receptor surface including the steps of: placing a donor element proximate a receptor surface, wherein the donor element includes a donor substrate and a thermal transfer layer, wherein the thermal transfer layer includes a catalytic material, and wherein the thermal transfer layer of the donor element is placed proximate the receptor surface; thermally transferring at least a portion of the thermal transfer layer from the donor element to the receptor surface; and electrolessly depositing a metallic material on the receptor surface by growth of the metallic material on the catalytic material.

Methods disclosed herein offer a process for the electroless plating of metals. In an embodiment, it can involve the use of an electroless plating solution that contains a soluble form of the deposit metal together with a reducing agent. The soluble form of the deposit metal is usually an ionic species or a metal complex (i.e., a metal species coordinated to one or more ligands). Generally, the process does not include the application of electrical current to a work piece that is being coated. The process generally utilizes a catalytic surface. Once the deposition begins at the catalytic surface, plating proceeds by the continued reduction of the solution metal source, catalyzed by its own metal surface, hence the term "autocatalytic." In embodiments of the method, the catalytic surface can be provided by a catalytic material, such as a noble metal seed layer, or by reducing a catalyst precursor, such as the salt of a noble metal, to form such a layer.

Methods that are disclosed herein utilize principles and materials that are associated with Laser Induced Thermal Imaging (LITI). Further details regarding LITI donor films, and methods of utilizing them can be found in U.S. Pat. Nos. 6,866,979; 6,586,153; 6,468,715; 6,284,425; 6,194,119; and 5,725,989, all of which are incorporated herein by reference thereto. LITI is generally a dry, digital patterning method in which a thin film coating is selectively transferred from a donor, across a space, to a receptor. The areas of the donor that are exposed to a source of thermal energy are transferred to the receptor.

One example of a donor element 100 is illustrated in FIG. 1a. The exemplary donor element 100 includes a donor substrate 102, and a thermal transfer layer 104.

The donor substrate 102 can be formed from any useful material, such as a polymer film. One suitable type of polymer film is a polyester film, for example, polyethylene terephthalate (PET) or polyethylene naphthalate (PEN) films. However, other films with sufficient optical properties (optical properties may be relevant if light is used for heating and transfer), including high transmission of light at a particular wavelength, as well as sufficient mechanical and thermal stability for the particular application, can be used. The donor substrate 102, in at least some instances, can be flat so that uniform coatings can be formed thereon. The donor substrate 102 can also typically be selected from materials that remain stable despite being heating, or heating of adjoining layers of the donor element. In an embodiment, the thickness of a donor substrate can range from 0.025 mm to 0.15 mm. In an embodiment, the thickness of a donor substrate can range from 0.05 mm to 0.1 mm. One of skill in the art will also understand that thicker or thinner donor substrates may also be used.

Donor elements 100 also include a thermal transfer layer 104. Thermal transfer layer 104 for use as disclosed herein include catalytic material. Catalytic materials include materials that can provide a catalytic site on a surface to make electroless deposition possible and materials that can be made to catalyze the growth of metallic materials in an electroless deposition process. For example, compounds that can be made to catalyze the growth of metallic materials by a reduction reaction to form an active catalytic material. Materials that can be made to catalyze the growth of metallic materials are often referred to as catalyst precursors. Generally, the catalytic material can be present in continuous or discontinuous thin films, in a colloidal dispersion (e.g. nanoparticles or inks based on metal nanoparticles such as those available from Advanced Nano Products, Korea), and catalyst precursors as discussed above. In one embodiment, a catalytic material does not include a colloidal dispersion.

Examples of materials that can catalyze the growth of metallic materials include, but are not limited to, metals such as main group metals, transition metals, noble metals, rare earth metals, and metalloids. In an embodiment, group VIII B elements or group I B elements can be utilized. Specific metals include, but are not limited to, aluminum, scandium, titanium, vanadium, chromium, manganese, iron, cobalt, nickel, copper, zinc, gallium, germanium, yttrium, zirconium, niobium, molybdenum, technetium, ruthenium, rhodium, palladium, silver, indium, tin, antimony, lanthanum, gadolinium, hafnium, tantalum, tungsten, rhenium, osmium, iridium, platinum, gold, thallium, or combinations thereof. In an embodiment, the metal, or metals are non-ferromagnetic; for example, copper, gold, iridium, palladium, platinum, rhodium, silver, rhenium, ruthenium, osmium, indium, and tin. In an embodiment, one or more noble metals are utilized. Materials that contain one or more metals can also be used as a catalytic material. For example, salts or complexes of metals, such as salts of transition metals, for example salts of palladium, platinum, and silver can be utilized. Salts of metals can be inorganic, such as palladium chloride, or organic, such as palladium acetate or palladium propanoate. In an embodiment, alkanoate salts can be utilized.

In an embodiment, a composition that includes a catalytic material, such as a metal as exemplified above, can be utilized. For example, a composition that includes metal nanoparticles, such as palladium or silver nanoparticles; or copper or nickel nanoparticles can be utilized. In an embodiment, the thermal transfer layer 104 can include a vapor deposited metal, such as vapor deposited palladium.

Catalytic materials also include materials, referred to herein as catalyst precursors that can be made to catalyze the growth of a metallic material. In an embodiment, a catalyst precursor can be made to catalyze the growth of a metallic material by subjecting it to an activating condition. In an embodiment, for example, an organic material that can complex a metal, such as those exemplified above can be utilized as a catalyst precursor. In such an embodiment, the activating condition is exposure of the catalyst precursor to a solution containing a metal for example. In an embodiment, for example, a material that, once exposed to a source of energy, can catalyze the growth of a metallic material can be utilized as a catalyst precursor. In such an embodiment, the activation condition is exposure to a source of energy. In an embodiment, for example, a material that, once subjected to an ion-exchange process, can catalyze the growth of a metallic material can be utilized as a catalyst precursor. In such an embodiment, the activating condition is exposure of the catalyst precursor to a solution that contains a metal for example that can replace an ion in the catalyst precursor.

In an embodiment, the activating condition can be a chemical reaction. For example, a catalyst precursor that includes a metal ion, such as $Pd^{2+}$ or $Ag^{2+}$, can be exposed to a solution that will reduce the $Pd^{2+}$ to $Pd^0$ or $Ag^{2+}$ to $Ag^0$. Exemplary reducing agents that can be utilized include, but are not limited to, tin ($Sn^{2+}$), formaldehyde, sodium borohydride, hydrazine, hydrazine hydrate, hydrazine sulfate, and dihydrazine sulfate.

In an embodiment where the catalyst precursor is reduced to form an active catalyst, the thermal transfer layer 104 can include the catalyst precursor and the reducing agent. For example, the thermal transfer layer could include $Pd^{2+}$ or $Ag^{2+}$, and a reducing agent, such as $Sn^{2+}$ for example. The material that catalyzes the growth of the metallic material, $Pd^0$ or $Ag^0$) for example could then be generated in situ. Alternatively, the thermal transfer layer 104 could include $Sn^{2+}$ which could then be exposed to a solution of $Pd^{2+}$ or $Ag^{2+}$, for example, to generate the $Pd^0$ or $Ag^0$ which catalyzes the growth of the metallic material. Alternatively, a thermal transfer layer 104 could include one layer that includes a catalyst precursor and one layer that includes a reducing agent. For example, a thermal transfer layer could include a layer that includes $Sn^{2+}$ and another layer that includes $Pd^{2+}$ or $Ag^{2+}$. The reduction of the $Pd^{2+}$ or $Ag^{2+}$ to $Pd^0$ or $Ag^0$ respectively, could then be accomplished by exposing the two layers to water, allowing the components to migrate to effect the reaction. In a similar fashion, the two layers could be transferred to the receptor surface in two separate steps. Then, once the two layers are transferred, the reaction could take place to create the catalyst. For example, the reaction could be initiated by dissolution and migration of the reactive species or by thermally induced migration, or by solvent induced mobility.

The reduction of the $Pd^{2+}$ or $Ag^{2+}$ to $Pd^0$ or $Ag^0$ respectively, could then be accomplished by exposing the two layers to water, allowing the components to migrate to effect the reaction. In a similar fashion, the two layers could be transferred to the receptor surface in two separate steps. Then, once the two layers are transferred, the reaction could take place to create the catalyst. For example, the reaction could be initiated by dissolution and migration of the reactive species or by thermally induced migration, or by solvent induced mobility.

In some cases, it may be desirable to physically separate the two chemically reactive layers with a porous or swellable inert layer until such time as a reaction is desired. We envision the use of a "separating layer" that would prevent the premature reaction of species in adjacent layers (e.g. an oxidizing and a reducing agent, an acid and a base, etc.) by acting as a chemical and/or physical barrier. A specific, non-limiting example of a separating layer is a solvent soluble polymer or polymer blend comprising, for example an acid functional acrylic (e.g. Elvacite 2776, Lucite International, Inc.), an amino functional acrylic (e.g. Elvacite 4115, Lucite International, Inc.), or a water swellable polymer such as cellulose acetate or cellulose acetate butyrate (both available from Sigma-Aldrich, Milwaukee, Wis.). Molecular or ionic transport across the separating layer could be initiated before or after the laser thermal patterning step by exposing the three layered transfer stack (e.g. oxidizing layer/separating layer/reducing agent) to an aqueous solution with a controlled pH that swells the separating layer without dissolving it. This transport would allow for reaction between the two previously separate layers. Porosity of the separating layer (hence, the rate of reaction between separated layers) could also be controlled by varying its thickness, crosslink density, or phase morphology.

Yet another class of materials that could be used as a separating layer is small molecules that readily sublime or decompose cleanly at relatively low temperature (e.g. those described in U.S. Pat. No. 5,756,689 "Diazo compounds for laser-induced mass transfer imaging materials", U.S. Pat. No. 5,747,217 "Laser-induced mass transfer imaging materials and methods utilizing colorless sublimable compounds", or U.S. Pat. No. 5,691,098 "Laser-Induced mass transfer imaging materials utilizing diazo compounds"). Molecular or ionic transport across a separating layer comprising one or more of these materials could be initiated before or after the laser thermal patterning step by gradual heating of the layers. This transport would allow for reaction between the two previously separate layers. Porosity of the separating layer (hence, the rate of reaction between separated layers) could also be controlled by varying its thickness or phase morphology.

In an embodiment where the catalyst precursor is activated by exposure to a source of energy, the thermal transfer layer 104 can include a catalyst precursor and can be exposed to the source of energy either before or after at least a portion thereof is transferred to the receptor In an embodiment, for example, a material that, once exposed to a source of energy, can catalyze the growth of a metallic material can be utilized as a catalyst precursor. For example, palladium acetate can be decomposed by exposure to intense UV radiation from an excimer laser to form a catalyst for electroless deposition (J.-Y. Zhang, H. Esrom, I. W. Boyd, Applied Surface Science 96-98 (1996) 399). In another example, alumina surfaces can be activated as electroless catalysts with exposure to intense UV radiation from an excimer laser (J.-Y. Zhang, I. W. Boyd, H. Esrom, Applied Surface Science 109-110 (1997) 253). In yet another example, copper acetylacetonate can be decomposed by exposure to intense UV radiation from an excimer laser to form a catalyst for electroless deposition (J.-Y. Zhang, H. Esrom, Applied Surface Science 54 (1992) 465).

A thermal transfer layer 104 as disclosed herein includes a catalytic material and can optionally include other materials. The other materials that may be included in the thermal transfer layer 104 are generally those that are to be included in an ultimate article or device that is to be fabricated using a method as disclosed herein. In one embodiment, the thermal transfer layer 104 optionally includes another material that can contribute to the ability of the thermal transfer layer to adhere to the receptor surface and/or contribute to the ability to expose the catalytic material to the electroless deposition bath.

In one embodiment, the thermal transfer layer 104 can include a polymer. In one embodiment, porous, swellable, or hydrogel polymeric materials can be utilized in order to easily allow the surface of the catalytic material to be at least partially exposed. Exposure of the surface of the catalytic material can be useful during electroless plating. In an embodiment, the optional other material included in the thermal transfer layer 104 can include a material that is capable of being etched or dissolved away. If such a material is utilized, an additional etching or dissolution step can be utilized before the metallic material is deposited.

In an embodiment, the thermal transfer layer 104 can include a material that enhances the adhesion of the thermal transfer layer 104 to the receptor surface. In one embodiment, the other alternative materials that contribute to the adherent nature of the thermal transfer layer 104 can be present in a separate layer of the thermal transfer layer 104 which is positioned farthest from the donor substrate so it is in contact with the receptor after transfer from the donor element to the receptor. For example, polymeric binder materials can be included in the thermal transfer layer 104. Polymeric binder material may be UV- or thermally crosslinkable, which can then be crosslinked, to enhance adhesion, after the thermal transfer layer 104 is transferred from the donor element to the receptor surface. Examples of polymeric binders that can be included in thermal transfer layers include, but are not limited to UV-crosslinkable materials or thermally crosslinkable materials such as those which can be crosslinked by exposure to heat or radiation, and/or by the addition of an appropriate chemical curative (e.g., $H_2O$, $O_2$, etc.). In one embodiment, radiation curable materials can be utilized. Suitable materials include those listed in the Encyclopedia of Polymer Science and Engineering, Vol. 4, pp. 350-390 and 418-449 (John Wiley & Sons, 1986), and Vol. 1, pp. 186-212 (John Wiley & Sons, 1988).

Generally, both insulating and conductive crosslinkable polymeric binder materials can be utilized herein. Insulating crosslinkable polymers as are generally known to those of skill in the art can be utilized. An example of an insulating crossslinkable polymer that can be utilized includes acrylates. Conductive crosslinkable polymers as are generally known to those of skill in the art can be utilized. Examples of conductive crosslinkable polymers include, but are not limited to, polyanilines, polyacetylenes, polyphenylenes, polyfluorenes, and poly(3,4-ethylenedioxythiophene) (PEDOT).

Specific examples of crosslinkable materials that can be utilized include, but are not limited to, silane functionalized triarylamine, the poly(norbornenes) with pendant triarylamine as disclosed in Bellmann et al., Chem Mater 10, pp. 1668-1678 (1998), bis-functionalized hole transporting triarylamine as disclosed in Bayerl et al., Macromol. Rapid Commun. 20, pp. 224-228 (1999), the various crosslinked conductive polyanilines and other polymers as disclosed in U.S. Pat. No. 6,030,550, the crosslinkable polyarylpolyamines disclosed in International Publication WO 97/33193, and the crosslinkable triphenyl amine-containing polyether ketone as disclosed in Japanese Unexamined Patent Publication Hei 9-255774; the disclosures of which are incorporated herein by reference.

Such an embodiment of a thermal transfer layer may also include optional additives, including but not limited to, chelating agents (for example EDTA), coupling agents, metal adhesion promoters (for example imidazoles), coating aids (for example surfactants, dispersants, etc.) or other coating additives. Other components can also be added to impart desired characteristics or desired processing advantages.

The thermal transfer layer 104 can optionally include more than one layer. A thermal transfer layer that includes more than one layer can be referred to as a multicomponent transfer unit. (U.S. Pat. No. 6,194,119 did not include a specific definition of multicomponent transfer unit) These one or more layers may be formed using organic, inorganic, organometallic, and other materials. Although the transfer layer is described and illustrated as having one or more discrete layers, it will be appreciated that, at least in some instances where more than one layer is used, there may be an interfacial region that includes at least a portion of each layer. This may occur, for example, if there is mixing of the layers or diffusion of material between the layers before, during, or after transfer of the transfer layer. In other instances, individual layers may be completely or partially mixed before, during, or after transfer of the transfer layer. This can be accomplished through the use of separation layers, as discussed above. In any case, these structures will be referred to as including more than one independent layer, particularly if different functions of a final article are to be performed by the different regions.

One advantage of using a multicomponent transfer unit, particularly if the layers do not mix, is that the important interfacial characteristics of the layers in the multicomponent transfer unit can be produced when the thermal transfer unit is prepared and, in one embodiment, retained during transfer.

One example of a thermal transfer layer includes a single or multicomponent transfer unit that is used to form at least part of a multilayer construction on a receptor. In some cases, the thermal transfer layer may include all of the layers needed to form a desired construction. In other cases, the thermal transfer layer may include fewer than all the layers needed to form a desired construction, the other layers being formed via transfer from one or more other donor elements or via some other suitable transfer or patterning method before, after, or both before and after the transfer of the thermal transfer layer. In still other instances, one or more layers of a construction may be provided on the surface of the receptor, the remaining layer or layers being included in the thermal transfer layer of one or more donor elements. Alternatively, one or more additional layers of a construction may be transferred onto the receptor after the thermal transfer layer has been patterned. In some instances, the thermal transfer layer is used to form only a single layer of a construction.

In an embodiment, an exemplary thermal transfer layer includes a multicomponent transfer unit that is capable of forming at least two layers of a multilayer construction. These two layers of the multilayer construction often correspond to two layers of the thermal transfer layer.

The thermal transfer layer may include an optional adhesive layer disposed on an outer surface of the thermal transfer layer to facilitate adhesion to the receptor. The adhesive layer may provide other functions as well, for example the adhesive layer may conduct electricity between the receptor and the other layers of the transfer layer or may only adhere the transfer layer to the receptor. The adhesive layer may be formed using, for example, thermoplastic polymers, including conducting and non-conducting polymers, conducting and non-conducting filled polymers, and/or conducting and non-conducting dispersions. Examples of suitable polymers include, but are not limited to, acrylic polymers, polyanilines, polythiophenes, poly(phenylenevinylenes), polyacetylenes, and other conductive organic materials known to one of skill in the art, having read this specification. Examples of suitable conductive dispersions include inks containing carbon black, graphite, carbon nanotubes, ultrafine particulate indium tin oxide, ultrafine antimony tin oxide, and commercially available materials from companies such as Nanophase Technologies Corporation (Burr Ridge, Ill.) and Metech (Elverson, Pa.). Conductive adhesive layers can also include vapor or vacuum deposited organic conductors such as N,N'-bis(1-naphthyl)-N,N'-diphenylbenzidine (also known as NPB).

An embodiment that includes a multicomponent transfer layer can optionally include a layer on the top (the layer that is farthest from the donor substrate, that will be directly on the receptor surface after transfer) that provides desired characteristics in an article after the thermal transfer layer is transferred to the receptor. For example, in an embodiment, it could be advantageous to have a conductive layer on the receptor before the layer containing the catalyst. Such a construction could be advantageous in fabricating an article in which electrical connectivity from the substrate to the metallic material is desired. Examples of materials that can be included in a layer such as this include, but are not limited to, conductive particles and conductive polymers. It could also be advantageous to have an insulating layer on the receptor before the layer containing the catalyst. Such a construction could be advantageous in fabricating an article in which electrical insulation between the substrate and the metallic material is desired. Examples of materials that can be included in a layer such as this include, but are not limited to insulating polymers.

Although the thermal transfer layer may be formed with discrete layers, it will be understood that, in at least some embodiments, the thermal transfer layer may include layers that have multiple components and/or multiple uses in the construction. It will also be understood that, at least in some embodiments, two or more discrete layers may be mixed together during transfer or otherwise combined or reacted. In any case, these layers, although mixed or combined, will be referred to as individual layers. For example, in an embodiment that includes an adhesive layer as discussed above, the material of the adhesive layer may be present in a separate layer, in two separate layers that have mixed somewhat, or in one layer that includes the adhesive as well as the catalytic material (and other optional materials that may be present).

Figure 1B:
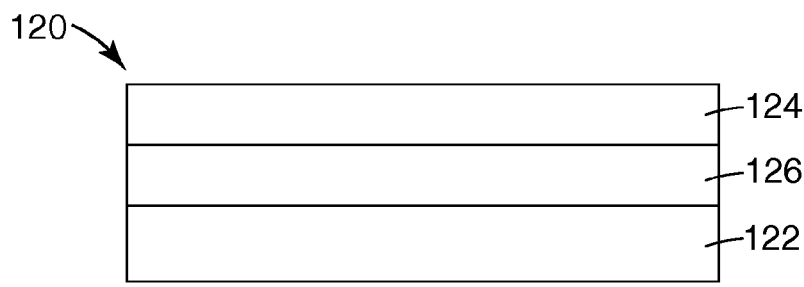
FIG. 1b is a schematic cross section of one example of a donor element as disclosed herein.

FIG. 1b illustrates another embodiment of a donor element 120. This exemplary donor element 120 includes a donor substrate 122, a thermal transfer layer 124, and also includes a light to heat conversion (LTHC) layer 126 disposed between the donor substrate 122 and the thermal transfer layer 124. The LTHC layer 126 contains a radiation absorber that converts light energy to heat energy. The conversion of the light energy to heat energy results in the transfer of at least a portion of the thermal transfer layer 124 to a receptor (not shown).

In radiation-induced thermal transfer the LTHC layer 126 couples the energy of the light radiated from a light-emitting source into the donor element. In one embodiment, a LTHC layer includes a radiation absorber that absorbs incident radiation (e.g., laser light) and converts at least a portion of the incident radiation into heat to enable transfer of the thermal transfer layer from the donor element to the receptor. In some embodiments, there is no separate LTHC layer and, instead, the radiation absorber is disposed in another layer of the donor element, such as the donor substrate or the thermal transfer layer. In other embodiments, the donor element includes an LTHC layer and also includes additional radiation absorber(s) disposed in one or more of the other layers of the donor element, such as, for example, the donor substrate or the thermal transfer layer. In yet other embodiments, the donor element does not include an LTHC layer or radiation absorber and the thermal transfer layer is transferred using a heating element that contacts the donor element.

Typically, the radiation absorber in the LTHC layer (or other layers) absorbs light in the infrared, visible, and/or ultraviolet regions of the electromagnetic spectrum. The radiation absorber is typically highly absorptive of the selected imaging radiation, providing an optical density at the wavelength of the imaging radiation in the range of 0.2 to 3, and in one embodiment from 0.5 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers can include carbon black, metal oxides, and metal sulfides.

One example of a suitable LTHC layer can include a pigment, such as carbon black, and a binder, such as an organic polymer. Another suitable LTHC layer can include metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques.

Radiation absorber material can be uniformly disposed throughout the LTHC layer or can be non-homogeneously distributed. For example, as described in U.S. Pat. No. 6,228,555, the disclosure of which is incorporated herein by reference thereto, non-homogeneous LTHC layers can be used to control temperature profiles in donor elements. This can give rise to donor elements that have higher transfer sensitivities (e.g., better fidelity between the intended transfer patterns and actual transfer patterns).

Dyes suitable for use as radiation absorbers in an LTHC layer may be present in particulate form, dissolved in a binder material, or at least partially dispersed in a binder material When dispersed particulate radiation absorbers are used, the particle size can be, at least in some instances, about 10 μm or less, and may be about 1 μm or less. Suitable dyes include those dyes that absorb in the IR region of the spectrum. Examples of such dyes may be found in Matsuoka, M., "Infrared Absorbing Materials", Plenum Press, New York, 1990; Matsuoka, M., Absorption Spectra of Dyes for Diode Lasers, Bunshin Publishing Co., Tokyo, 1990, U.S. Pat. Nos. 4,722,583; 4,833,124; 4,912,083; 4,942,141; 4,948,776; 4,948,778; 4,950,639; 4,940,640; 4,952,552; 5,023,229; 5,024,990; 5,156,938; 5,286,604; 5,340,699; 5,351,617; 5,360,694; and 5,401,607; European Patent Nos. 321,923 and 568,993; and Beilo, K. A. et al., J. Chem. Soc., Chem. Commun., 1993, 452-454 (1993), all of which are herein incorporated by reference. IR absorbers marketed by Glendale Protective Technologies, Inc., Lakeland, Fla., under the designation CYASORB IR-99, IR-126 and IR-165 may also be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, incorporated herein by reference, or as films, as disclosed in U.S. Pat. No. 5,256,506, incorporated herein by reference. Suitable metals include, for example, aluminum, bismuth, tin, indium, tellurium and zinc.

As indicated, a particulate radiation absorber may be disposed in a binder. The weight percent of the radiation absorber in the coating, excluding the solvent in the calculation of weight percent, is generally from 1 wt-% to 30 wt-%, in an embodiment from 3 wt-% to 20 wt-%, and in another embodiment from 5 wt-% to 15 wt-%, depending on the particular radiation absorber(s) and binder(s) used in the LTHC.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been or can be polymerized or crosslinked. In some embodiments, the binder is primarily formed using a coating of crosslinkable monomers and/or oligomers with optional polymer. When a polymer is used in the binder, the binder includes 1 to 50 wt-%, in an embodiment, 10 to 45 wt-%, polymer (excluding the solvent when calculating wt-%).

Upon coating on the donor substrate, the monomers, oligomers, and polymers may be crosslinked to form the LTHC. In some instances, if crosslinking of the LTHC layer is too low, the LTHC layer may be damaged by the heat and/or permit the transfer of a portion of the LTHC layer to the receptor with the transfer layer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt-% (excluding the solvent when calculating weight percent) thermoplastic resin, and, in one embodiment, 30 to 45 wt-% thermoplastic resin, although lower amounts of thermoplastic resin may be used (e.g., 1 to 15 wt-%). The thermoplastic resin is typically chosen to be compatible (i.e., form a one-phase combination) with the other materials of the binder. A solubility parameter can be used to indicate compatibility, as is known to one of skill in the art. In at least some embodiments, a thermoplastic resin that has a solubility parameter in the range of 9 to 13 (cal/ cm$^3$)$^{1/2}$, in one embodiment, 9.5 to 12 (cal/cm$^3$)$^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 μm to 20 μm, in one embodiment, 0.5 μm to 10 μm, and, in one embodiment, 1 μm to 7 μm. An inorganic LTHC layer is coated, in at least some instances, to a thickness in the range of 0.001 to 10 μm, and in one embodiment, 0.002 to 1 μm.

Figure 1C:
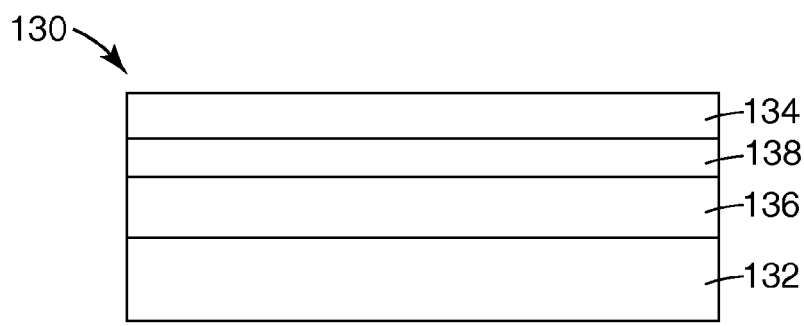
FIG. 1c is a schematic cross section of one example of a donor element as disclosed herein.

Another example of a donor element 130 is illustrated in FIG. 1c, and includes a donor substrate 132, an LTHC layer 136, an interlayer 138, and a thermal transfer layer 134. The interlayer 138 is generally disposed between the LTHC layer 136 and the thermal transfer layer 134 in donor elements in order to minimize damage and contamination of the transferred portion of the thermal transfer layer and may also reduce distortion in the transferred portion of the thermal transfer layer. The interlayer 138 may also influence the adhesion of the thermal transfer layer to the rest of the donor element. Typically, the interlayer 138 has high thermal resistance. In one embodiment, the interlayer 138 does not distort or chemically decompose under the imaging conditions, particularly to an extent that renders the transferred image non-functional. The interlayer 138 typically remains in contact with the LTHC layer 136 during the transfer process and is not substantially transferred with the thermal transfer layer 134.

Suitable interlayers 138 include, but are not limited to, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include, but are not limited to, both thermoset and thermoplastic materials. Suitable thermoset materials include, but are not limited to, resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer 136 as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is about 25° C. or greater, in one embodiment 50° C. or greater, in one embodiment 100° C. or greater, and, in another embodiment, 150° C. or greater. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material of the LTHC layer, the material of the transfer layer, the wavelength of the imaging radiation, and the duration of exposure of the thermal transfer element to imaging radiation. For polymer interlayers, the thickness of the interlayer typically is in the range of 0.05 μm to 10 μm, in an embodiment, from about 0.1 μm to 4 μm, in an embodiment, 0.5 to 3 μm, and, in an embodiment, 0.8 to 2 μm. For inorganic interlayers (e.g., metal or metal compound interlayers), the thickness of the interlayer typically is in the range of 0.005 μm to 10 μm, in an embodiment, from about 0.01 μm to 3 μm, and, in an embodiment, from about 0.02 to 1 μm.

Figure 1D:
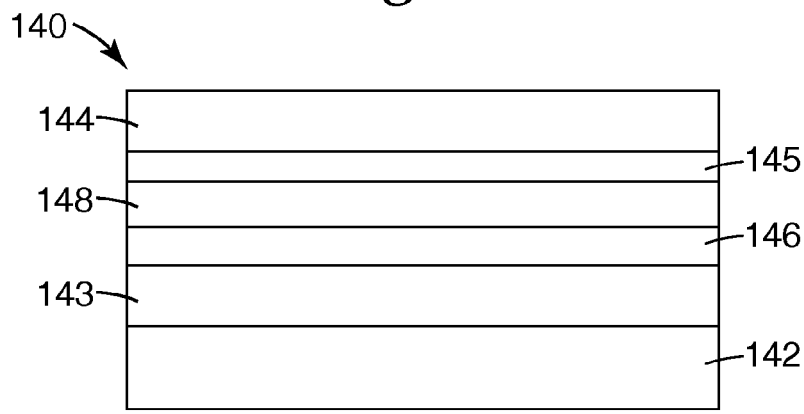
FIG. 1d is a schematic cross section of one example of a donor element as disclosed herein.

Another suitable donor element 140, illustrated in FIG. 1d includes a donor substrate 142, an LTHC layer 146, a thermal transfer layer 144, an interlayer 148, an optional primer layer 143, and an optional release layer 145.

Donor elements can include an optional release layer 145. The optional release layer 145 typically facilitates release of the thermal transfer layer 144 from the rest of the donor element (e.g., the interlayer and/or the LTHC layer) upon heating of the donor element, for example, by a light-emitting source or a heating element. In at least some cases, the release layer provides some adhesion of the thermal transfer layer to the rest of the donor element prior to exposure to heat. Suitable release layers include, but are not limited to, conducting and non-conducting thermoplastic polymers, conducting and non-conducting filled polymers, and/or conducting and non-conducting dispersions. Examples of suitable polymers include acrylic polymers, polyanilines, polythiophenes, poly (phenylenevinylenes), polyacetylenes, and other conductive organic materials known to those of skill in the art. Examples of suitable conductive dispersions include inks containing carbon black, graphite, ultrafine particulate indium tin oxide, ultrafine antimony tin oxide, and commercially available materials from companies such as Nanophase Technologies Corporation (Burr Ridge, Ill.) and Metech (Elverson, Pa.). Other suitable materials for the release layer include sublimable insulating materials and sublimable semiconducting materials (such as phthalocyanines), including, for example, the materials described in U.S. Pat. No. 5,747,217, incorporated herein by reference.

The optional release layer 145 may be part of the thermal transfer layer or may be a separate layer. All or a portion of the release layer may be transferred with the thermal transfer layer. Alternatively, most or substantially all of the release layer can remain with the donor substrate when the thermal transfer layer is transferred. In some instances, for example with a release layer that includes a sublimable material, a portion of the release layer may be dissipated during the transfer process.

Typically, the materials used to form the donor substrate 142 and the LTHC layer 146 are selected to improve adhesion between the LTHC layer 146 and the donor substrate 142. An optional priming layer 143 can be used to increase uniformity during the coating of subsequent layers and also increase the interlayer bonding strength between the LTHC layer 146 and the donor substrate 142. One example of a suitable substrate with an optional primer layer is available from Teijin Ltd. (Product No. HPE100, Osaka, Japan).

Materials can be coated onto donor substrates to form the thermal transfer layers of the donor elements. The thermal transfer layer materials can then be patterned via selective thermal transfer from the donor to a receptor. Coating onto a donor followed by patterning via selective transfer represents a de-coupling of layer coating steps from patterning steps. An advantage of de-coupling coating and patterning steps is that materials can be patterned on top of or next to other materials that would be difficult to pattern, if possible at all, using conventional patterning processes. For example, in methods as described herein, a solvent-coated layer can be patterned on top of a solvent-susceptible material that would be dissolved, attacked, penetrated, and/or rendered inoperable for its intended purpose in the presence of the solvent had the solvent-coated layer been coated directly on the solvent-susceptible material.

A thermal transfer layer of a donor element can be made by solvent-coating a first material on the donor, suitably drying the coating, and then depositing a second layer that includes material that may be susceptible to the solvent used to coat the first material. Damage to the second layer can be minimized or eliminated by evaporation, or otherwise removal, of much or most of the solvent before coating of the second layer. Upon thermal transfer of this multicomponent thermal transfer layer from the donor element to a receptor, the second layer becomes positioned between the receptor and the solvent-coated first material. Thermal transfer of multiple layer units results in a reverse ordering of the transferred layers on the receptor relative to the ordering on the donor element. Because of this, solvent-susceptible layers can be patterned underneath solvent-coated layers. In addition, the layers need not be transferred together as a multiple layer unit. The solvent-susceptible material(s) can be patterned by any suitable method, including thermal transfer from a donor element, followed by another thermal transfer step using another donor to transfer the solvent-coated material(s). The same holds for patterned thermal transfer of solvent-coated materials next to, but not necessarily in contact with, materials or layers on a receptor that may be incompatible with the solvent.

Figure 2A:
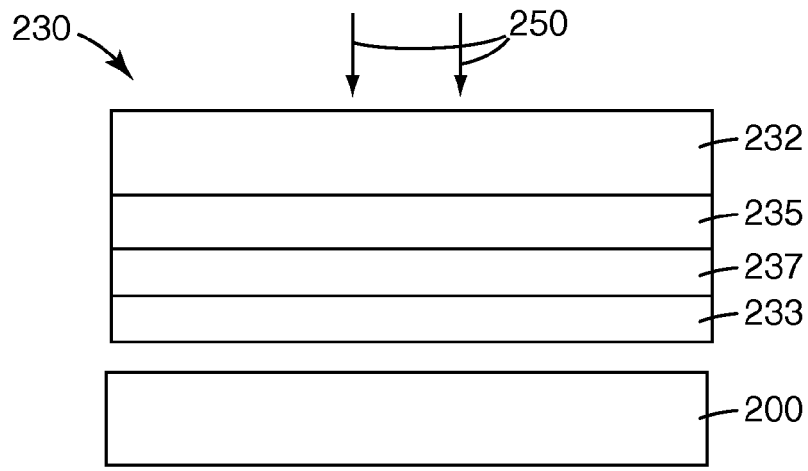
FIGS. 2a-2c are schematic cross sections illustrating at least a portion of a donor element having a donor substrate, a light to heat conversion (LTHC) layer, an interlayer, and a thermal transfer layer being transferred to the surface of a receptor.
Figure 2B:
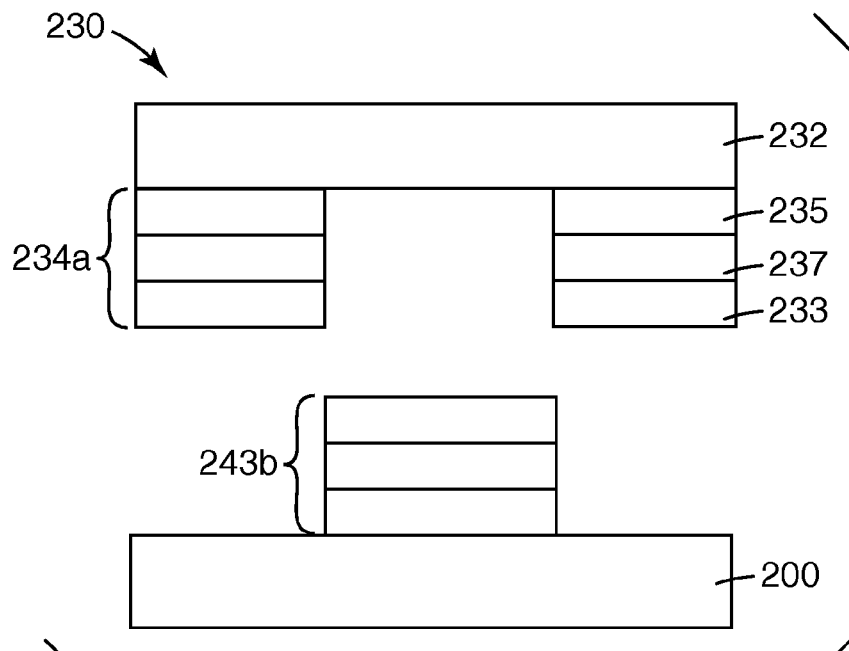
Figure 2C:
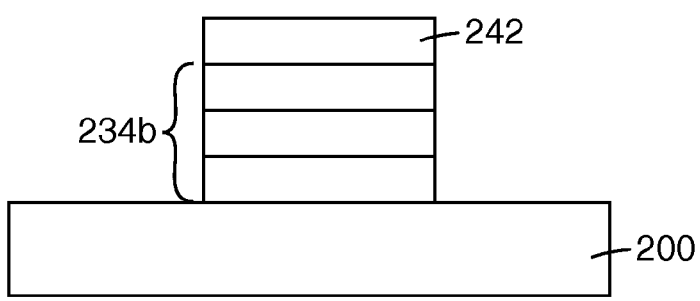

An exemplary method is illustrated in FIGS. 2a-2c. FIG. 2a illustrates the step of placing a donor element 230, discussed above, proximate the surface of a receptor 200. This illustrative donor element 230 includes a donor substrate 232, and a thermal transfer layer 234, which is made up of a release layer 235, a catalytic layer 237 (a layer that includes the catalytic material), and a polymer layer 233 (a layer that includes a polymeric binder material). In some embodiments, the catalytic layer 237 and the polymer layer 233 can be one homogeneous layer. In an embodiment, the donor element is brought into contact with the receptor surface. The donor element and receptor are configured so that the thermal transfer layer of the donor element is placed proximate the surface of the receptor. In at least some embodiments, pressure or vacuum can be used to hold the donor element in intimate contact with the receptor surface.

The receptor to which the donor element can be transferred can include any material which the thermal transfer layer can adhere to or can be made to adhere to. The particular receptor that will be utilized can depend at least in part on the article that is being fabricated using a method disclosed herein. Examples of receptors include, but are not limited to any useful material, such as a polymer film, glass, or metal. One suitable type of polymer film is a polyester film, for example, PET or PEN films. In one embodiment, glass is the receptor. In another embodiment, the receptor comprises glass or polymer as a support for electrical or electronic circuitry such as a flat panel display backplane, or elements thereof. Exemplary receptors that can be utilized can be conditioned or treated prior to thermal transfer of the thermal transfer layer. The conditioning could include cleaning treatments such as exposure to a plasma or a reactive chemical such as ozone or an organic peroxide. The treatment could also optionally include chemical surface modification with, for example, a silane coupling agent or a surfactant.

In methods disclosed herein, after the donor element is placed proximate the receptor, at least a portion of the thermal transfer layer of the donor element is thermally transferred to the receptor. The arrows 250 in FIG. 2a schematically illustrate the application of thermal energy, which transfers at least a portion of the donor element 230 to the receptor 200. The energy, which is applied to at least a portion of the donor element 230, functions to transfer the portion of the thermal transfer layer 234 which is exposed to the energy.

For thermal transfer using radiation (e.g., light), a variety of radiation-emitting sources can be used in the disclosed methods. In one embodiment, the transfer is accomplished with a laser. For analog techniques (e.g., exposure through a mask), high-powered light sources (e.g., xenon flash lamps and lasers) are useful. For digital imaging techniques, infrared, visible, and ultraviolet lasers can be particularly useful. Suitable lasers include, for example, high power (e.g. $\geq 100$ mW) single mode laser diodes, fiber-coupled laser diodes, and diode-pumped solid state lasers (e.g., Nd:YAG and Nd:YLF). Laser exposure dwell times can be in the range from, for example, about 0.1 to 100 microseconds and laser fluxes can be in the range from, for example, about 0.01 to about 1 $J/cm^2$.

When high spot placement accuracy is disclosed (e.g. for high information full color display applications) over a large area, a laser can be particularly useful as the radiation source. Laser sources are compatible with both large rigid substrates such as 1 m×1 m×1 mm glass, and continuous or sheeted film substrates, such as 100 µm polyimide sheets.

Resistive thermal print heads or arrays may be used, for example, with simplified donor element constructions that do not include an LTHC layer and radiation absorber. This may be particularly useful with smaller substrate sizes (e.g., less than approximately 30 cm in any dimension) or for larger patterns, such as those required for alphanumeric segmented displays.

A radiation source can generally be used to heat the LTHC layer (and/or other layer(s) containing radiation absorber) in an imagewise fashion (e.g., digitally or by analog exposure through a mask) to perform imagewise transfer of the thermal transfer layer from the donor element to the receptor according to a pattern.

Alternatively, a heating element, such as a resistive heating element, may be used to transfer the thermal transfer layer. The donor element can be selectively contacted with the heating element to cause thermal transfer of a portion of the thermal transfer layer according to a pattern. In another embodiment, the donor element may include a layer that can convert an electrical current applied to the layer into heat.

Typically, the thermal transfer layer is transferred to the receptor without transferring any of the other layers of the donor element, such as the optional interlayer and the LTHC layer. The presence of the optional interlayer may eliminate or reduce the transfer of the LTHC layer to the receptor and/or reduce distortion in the transferred portion of the thermal transfer layer. In one embodiment, under imaging conditions, the adhesion of the interlayer to the LTHC layer is greater than the adhesion of the interlayer to the thermal transfer layer. In some instances, a reflective or an absorptive interlayer can be used to attenuate the level of imaging radiation transmitted through the interlayer and reduce any damage to the transferred portion of the thermal transfer layer that may result from interaction of the transmitted radiation with the thermal transfer layer and/or the receptor. This can be particularly beneficial in reducing thermal damage which may occur when the receptor is highly absorptive of the imaging radiation.

Large donor elements can be used, including donor elements that have length and width dimensions of a meter or more. In operation, a laser can be rastered or otherwise moved across the large donor element, the laser being selectively operated to illuminate portions of the donor element according to a desired pattern. Alternatively, the laser may be stationary and the donor element moved beneath the laser.

Materials can be patterned onto receptors by selective thermal transfer of the materials from one or more donor elements. A donor element can be heated by application of directed heat on a selected portion of the donor element. Heat can be generated using a heating element (e.g., a resistive heating element), converting radiation (e.g., a beam of light) to heat, and/or applying an electrical current to a layer of the donor element to generate heat. In many instances, thermal transfer using light from, for example, a lamp or laser, can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the donor element, and the materials of the donor element.

Thermal transfer using light can often provide better accuracy and quality control for very small devices, such as small optical and electronic devices, including, for example, transistors and other components of integrated circuits, as well as components for use in a display, such as electroluminescent lamps and control circuitry. Moreover, thermal transfer using light may, at least in some instances, provide for better registration when forming multiple devices over an area that is large compared to the device size. As an example, components of a display, which has many pixels, can be formed using this method.

In some instances, multiple donor elements may be used to form a device or other object, or to form adjacent devices, other objects, or portions thereof. The multiple donor elements may include donor elements with multicomponent thermal transfer units and donor elements that transfer a single thermal transfer layer. For example, a device or other object may be formed using one or more donor elements with multicomponent thermal transfer units and/or one or more donor elements that each can be used to transfer a single layer or a multilayer unit.

Thermal transfer of one or more layers to form a device or an array of devices can also be useful, for example, to reduce or eliminate wet processing steps of processes such as photolithographic patterning, which are used to form many electronic and optical devices. Thermal transfer to pattern layers from donor elements can also be useful to de-couple layer coating steps from patterning steps, for example where such coupling can limit the types of layered structures, or the types of adjacent structures, that can be patterned. In conventional patterning processes such as photolithography, ink-jet, screen printing, and various mask-based techniques, layers are typically coated directly onto the substrate on which patterning occurs. Patterning can take place simultaneously with coating (as for ink-jet, screen printing, and some mask-based processes) or subsequent to coating via etching or another removal technique. A difficulty with such conventional approaches is that solvents used to coat materials, and/or etching processes used to pattern materials, can damage, dissolve, penetrate, and/or render inoperable previously coated or patterned layers or materials.

FIG. 2b shows the donor element 230 and the receptor 200 after the donor element 230 has been exposed to energy. As illustrated in FIG. 2b, the portion of the donor element 230 that was exposed to the thermal energy is transferred to the receptor, i.e., the transferred portion 234b of the thermal transfer layer. The portion of the donor element 230 which was not exposed to the thermal energy maintains the thermal transfer layer on the donor substrate 232, i.e., the remaining portion 234a of the thermal transfer layer.

In an embodiment that includes a catalyst precursor, the catalyst precursor can be converted to an active catalyst before, during, or after at least a portion of the thermal transfer layer is transferred to the receptor. Depending on the type of catalyst precursor, the activating condition can be carried out before, during or after the thermal transfer step. In an embodiment, where the catalyst precursor is thermally converted into an active catalyst, the activating condition can occur during the thermal transfer of the thermal transfer layer. Alternatively, in an embodiment that includes a thermally activatable catalyst precursor, the catalyst precursor can be activated before or after the thermal transfer of the thermal transfer layer. For example, the catalyst precursor can be thermally treated to form nanoparticles before or after the thermal transfer layer is transferred.

Specifics of the thermal activation of the catalyst precursor would depend at least in part on the particular precursor that was being utilized. One of skill in the art, given the disclosure herein, would know how to activate particular catalyst precursors that could be utilized. For example, depending on the particular catalyst precursor that is being utilized, one of skill in the art would know the particular type and characteristics of activating energy that should be utilized. For example, some catalyst precursors can be activated by energy from a number of sources, including but not limited to, argon ion lasers, excimer lasers, Nd:YAG lasers, and synchrotron systems. One of skill in the art, having chosen a particular catalyst precursor would know the type of energy source, and the particular functional details of using that energy source.

After at least a portion of the thermal transfer layer is thermally transferred to the receptor, the next step in methods disclosed herein is to electrolessly deposit a metallic material on the receptor by growth of the metallic material on the catalytic material. FIG. 2c illustrates this exemplary article after the metallic material 242 has been deposited on the transferred portion 234b of the thermal transfer layer. In embodiments where the catalytic material is a catalyst precursor, the catalyst precursor can be converted to an active catalyst before or during the electroless deposition step. For example, the patterned receptor surface could be placed in an electroless deposition bath that includes a reducing agent.

The term "electroless deposition" refers to a process for the electroless plating of metals. It typically involves the use of an electroless plating solution that contains a soluble form of the deposit metal together with a reducing agent. The soluble form of the deposit metal is usually an ionic species or a metal complex (i.e., a metal species coordinated to one or more ligands). Generally, electroless deposition does not include the application of electrical current to a work piece that is being coated. Once the thermal transfer layer including the catalytic material is thermally transferred from the donor element to the receptor surface, the receptor can be immersed in an appropriate plating bath. The catalytic material, or an activated version of the catalytic material (in the case of a catalyst precursor) catalyzes the deposition of the deposit metal from the plating solution. Once started, plating proceeds by the continued reduction of the solution metal source, catalyzed by its own metal surface, hence the term "autocatalytic." In another embodiment, electroless deposition can involve displacement reactions. In such an embodiment, a first metal is immersed in a solution of metal salts of a second metal with a partial attack on the surface of the first metal and the simultaneous spontaneous deposition of the second metal at its surface. The first metal functions as the reducing agent, and is also referred to herein, when the term "catalytic material" is utilized.

Metallic materials that can be formed using electroless deposition include copper, nickel, gold, silver, palladium, rhodium, ruthenium, tin, cobalt, as well as alloys of these metals with each other or with phosphorous or boron, as well as compounds of these metals with each other or with phosphorous or boron. In another embodiment, zinc can be formed using electroless plating via a displacement mechanism instead of a autocatalysis mechanism. In one example, the metallic deposit metal includes copper, silver, gold, platinum, palladium, or some combination thereof. The deposit metal and the catalytic material can be the same or different.

In an embodiment where the catalytic material is a catalytic precursor that has to be reduced in order to catalyze electroless deposition, such reduction can occur separate from the catalytic growth of the deposit metal or coincident with the catalytic growth of the metallic deposit. Processes where the catalytic material is reduced separate from the catalytic growth may provide an advantage in that it can occur at a faster rate, allowing for processing advantages. The catalytic material can be reduced by photo-reduction, chemical reduction, heat reduction, or e-beam reduction. In an example where chemical reduction is utilized, suitable reducing agents include, but are not limited to, formaldehyde, hydrazine, borohydrides, aminoboranes, and hypophosphite.

Methods that include optional rinse steps before or after the step of electrolessly depositing the metallic deposit can also be utilized herein. One of skill in the art, having read this specification would also be aware of other steps that could be utilized in combination with the method steps disclosed herein.

Figure 3A:
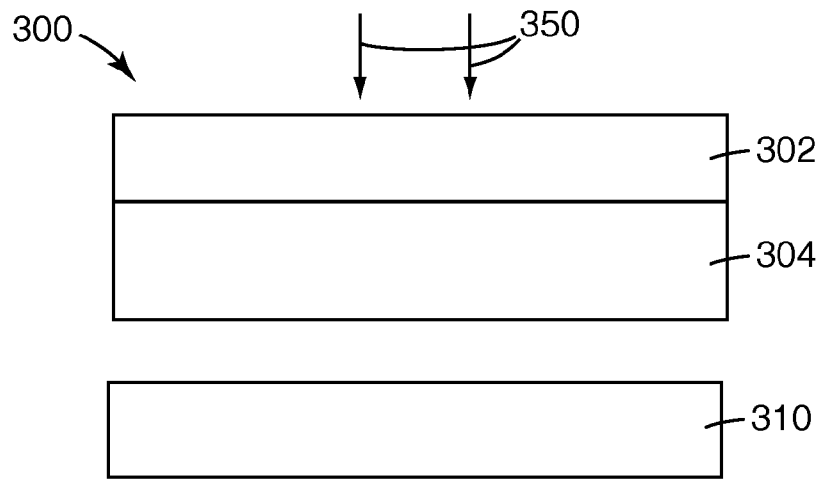
FIGS. 3a-3c are schematic cross sections illustrating at least a portion of a donor element having a thermal transfer layer being transferred to the surface of a receptor.
Figure 3B:
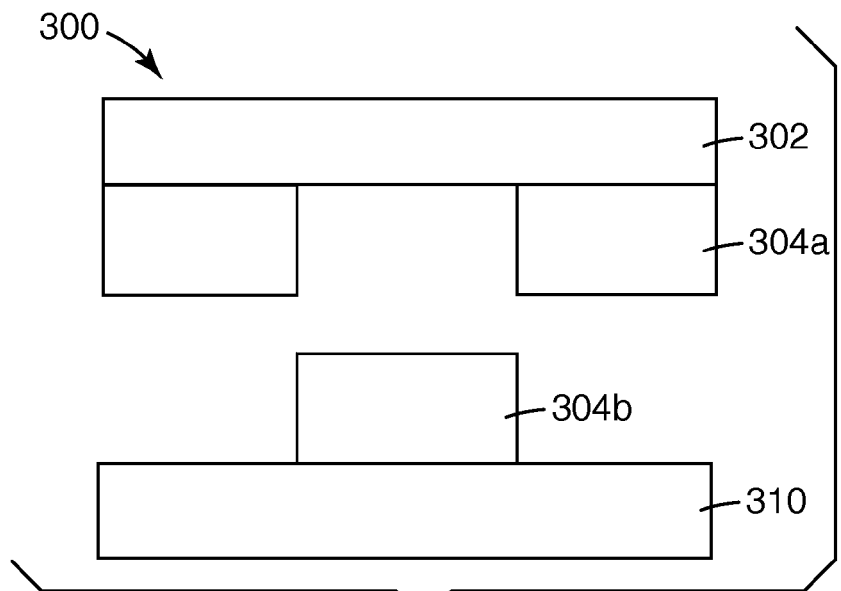
Figure 3C:
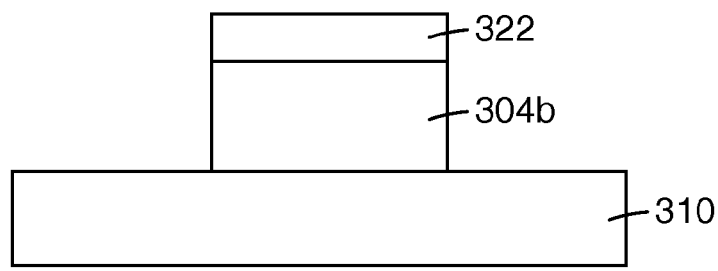

FIGS. 3a-3C depict another exemplary embodiment of a donor element 300 and a receptor 310. This exemplary donor element 300 includes at least a donor substrate 302 and a thermal transfer layer 304. This exemplary thermal transfer layer 304 generally includes the catalytic material. The arrows 350 in FIG. 3a schematically illustrate the energy that transfers at least a portion of the thermal transfer layer 304 to the receptor 310. As seen in FIG. 3b, after exposure of the donor element 300 to the energy, there is a transferred portion 304b of the thermal transfer layer on the receptor 310 and a remaining portion 304a of the thermal transfer layer 304 on the donor substrate 302. FIG. 3c illustrates the article after the metallic material 322 is deposited on the transferred portion 304b of the thermal transfer layer.

Figure 4:
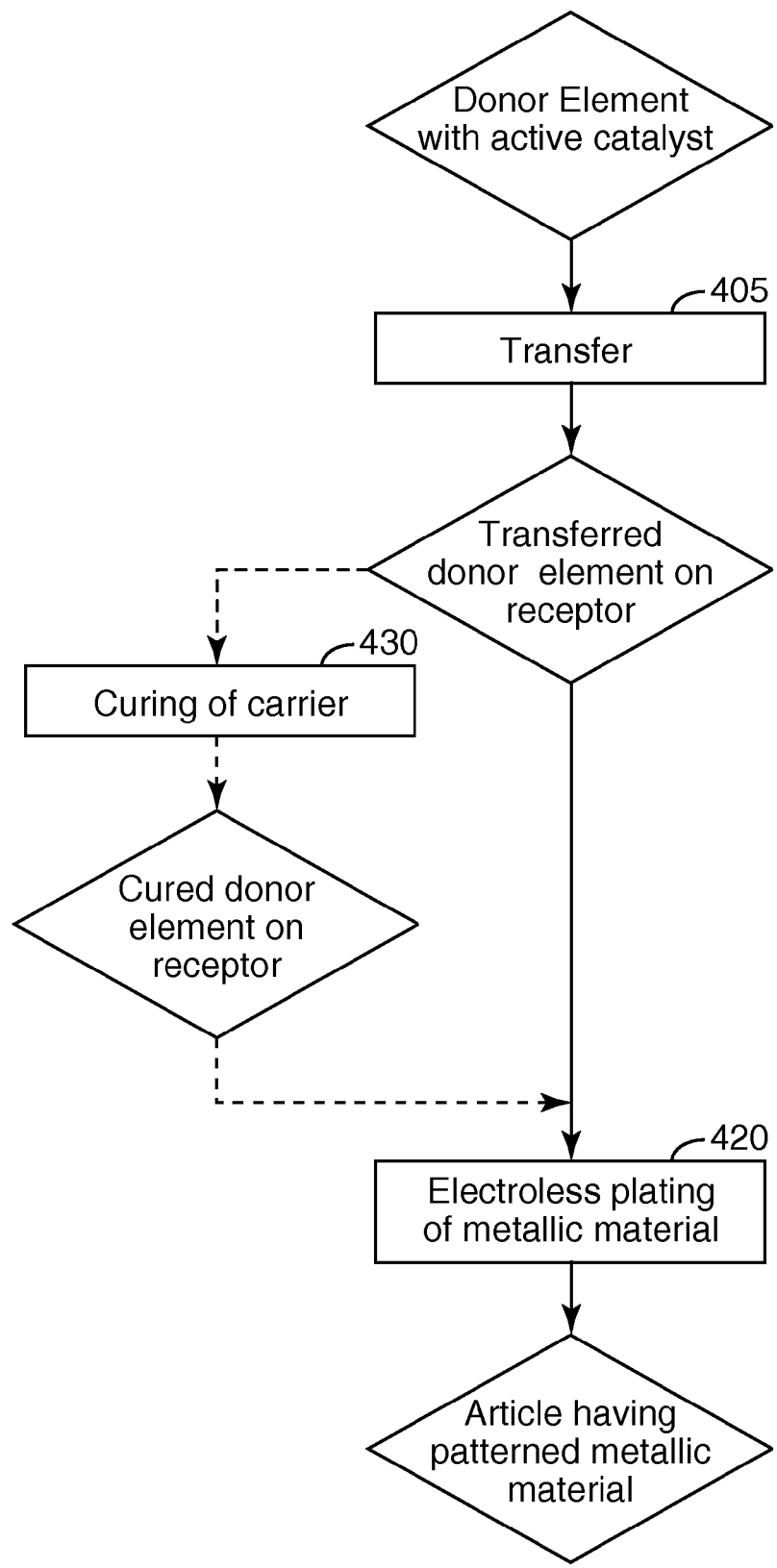
FIG. 4 illustrates an exemplary method of forming a patterned metallic material.

The various steps involved in methods as disclosed herein can generally be carried out in any order. FIG. 4 illustrates one exemplary method generally utilizing the steps disclosed herein. As seen there, at least a portion of donor element that includes a thermal transfer layer having a catalytic material, more specifically an active catalyst, is transferred (step 405) to a receptor. Then, the transferred portion of the thermal transfer layer is exposed to electroless plating (step 420) to deposit the metallic material on the transferred portion of the thermal transfer layer, thereby creating an article having a patterned metallic material. FIG. 4 also illustrates an optional step 430 of curing a carrier polymer that is included in the thermal transfer layer. The optional curing creates a cured thermal transfer layer on the receptor.

Figure 5:
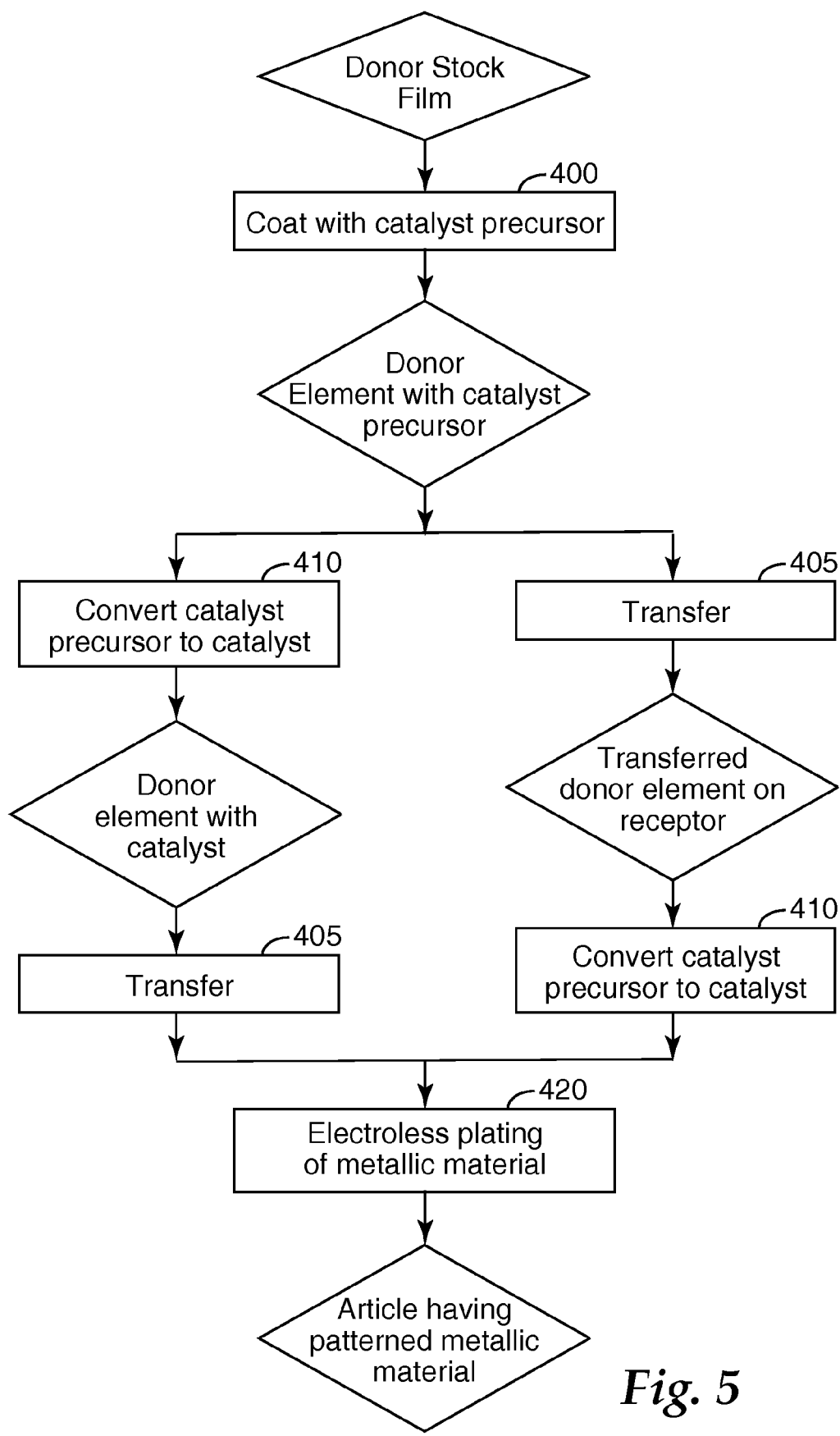
FIG. 5 illustrates an exemplary method of forming a patterned metallic material.

FIG. 5 illustrates another exemplary method generally utilizing the steps disclosed herein. This exemplary method demonstrates the production of the donor element by coating a donor stock film with a catalyst precursor (step 400) to create a donor element with a catalyst precursor. In one embodiment, a donor stock film can include a donor substrate, a LTHC layer, and an interlayer. The donor element including the catalyst precursor can then either have the catalyst precursor converted to the catalyst, step 410; or can have at least a portion of the thermal transfer layer transferred to the receptor, step 405. If the catalyst precursor is first converted, the thermal transfer can then be transferred to the receptor, step 405; or alternatively, if the thermal transfer layer was transferred first, the catalyst precursor can then be converted to an active catalyst; step 410. Either way, the next step is to electrolessly plate the metallic material, step 420, to create an article having a patterned metallic material.

Figure 6:
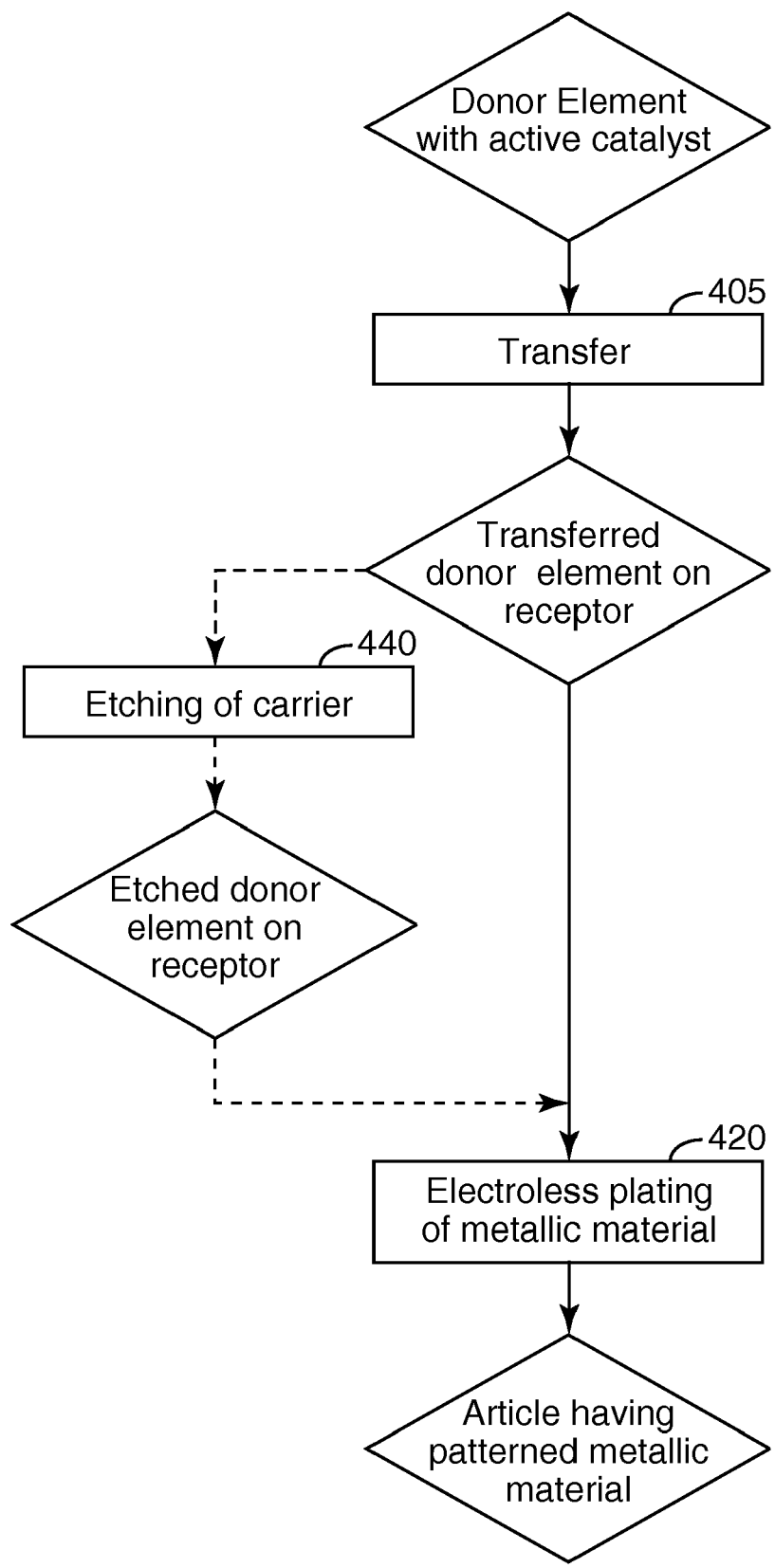
FIG. 6 illustrates an exemplary method of forming a patterned metallic material.

FIG. 6 illustrates another exemplary embodiment of a method that includes an optional step of etching 440 to more fully exposed the catalytic material to the electroless plating solution. One of skill in the art, can easily determine, based at least in part, on the particular polymeric binder how the catalytic material can be exposed.

One of skill in the art will understand, having read this specification, that any of the steps discussed in FIGS. 4-6, and in other portions of this specification can be combined in any applicable order to carry out a method as disclosed herein.

Also disclosed herein are articles that are formed using the methods described herein. Articles that can be fabricated using the disclosed methods generally have patterned portions of the thermal transfer layer that are covered with metallic materials. In an embodiment, the patterned portions of the thermal transfer layer covered with the metallic materials, i.e. the metallic coating, are referred to as the overall features. Generally, the portions of the thermal transfer layer and the metallic materials, i.e., the overall features, can be of any size. In an embodiment, the size of the overall features includes both the height of the patterned thermal transfer layer and the height of the metallic materials. Given this, the size of the overall features can be about 1 micrometer ($\mu$m) or larger in width, and about 20 nanometers (nm) or larger in height. In such an article, the size of the patterned portions of the thermal transfer layer can be about 1 $\mu$m or larger in width and about 20 nm or larger in height. Generally, the depth of the metallic materials on the patterned portions of the thermal transfer layer is about 1 angstrom (Å) or greater. One of skill in the art will understand that a thicker layer of metallic material can be obtained by plating the material for a longer period of time Exemplary articles described and formed herein can have grids of metallic material, and such articles can be used for example, for electromagnetic interference (EMI) shielding. Exemplary articles described and formed herein can have traces of metallic material, and such articles can be used for example, for touch screens, for sensor applications, for circuits, to make reflective indicia, or to create fluid flow devices (where the patterned metallic deposits can be hydrophilic and the non-patterned portions are hydrophobic). An exemplary article that could be formed using methods disclosed herein are flat panel display backplanes including multiple display backplanes on a mother glass, which includes copper or other conductive metal bus lines. Exemplary articles described and formed herein can have repeating dots or islands of metallic material, and such articles can be used for example, to create shielding effects. The articles include patterns of metallic deposits that can be used to conduct an electric current.

Exemplary articles described and formed herein can have reflective or semitransparent layers of metallic material, and such articles can be used for example, in microelectromechanical (MEMs) or microelectrooptical devices. Exemplary articles that can be formed using methods disclosed herein include micromirror arrays.

Exemplary articles that are described and formed herein can advantageously have the receptor, the portion of the thermal transfer layer, the metallic material, or some combination thereof matched so that thermal expansion properties of the overall article are similar. It will also be understood by one of skill in the art that once an article has been formed using a method as disclosed herein, further processing steps can be carried out on that article without deviating from the scope of this disclosure.

EXAMPLES

With these general concepts of the present disclosure in mind, exemplary donor elements, thermal transfer methods, and devices made by thermal transfer methods will now be described.

A donor stock film (donor substrate, LTHC layer, and interlayer) was prepared in the following manner. An LTHC solution (Table 1) was coated onto a polyethylene terephthalate (PET) film (M7Q, 2.88 mil, DuPont Teijin Films, Hopewell, Va.). The LTHC solution was applied with a laboratory microgravure coater (model CAG-150, Yasui Seiki, Kanagawa, Japan) to achieve a dry thickness of approximately 2.7 microns. The coating was in-line dried and cured under ultraviolet (UV) radiation. The cured coating had an optical density of approximately 1.18 when measured using incident light having a wavelength of 1064 nm. An Interlayer solution (Table 2) was coated using the same method as the LTHC to achieve a dry thickness of approximately 1.8 microns. The coating was in-line dried and cured under ultraviolet (UV) radiation.

TABLE 1

Light to Heat Conversion (LTHC) Layer Formulation

| Trade Name | Supplier | wt % | Weight % of non-volatiles | Comments |
| --- | --- | --- | --- | --- |
| Raven 760 | Columbian Chemicals Co. | 3.56 | 12.96 | carbon black IR absorber |
| Butvar B-98 | Solutia | 0.64 | 2.31 | polyvinyl butyral resin |
| Joncryl 67 | Johnson Polymer | 1.90 | 6.91 | modified styrene acrylic polymer |
| Disperbyk 161 | Byk-Chemie USA | 0.32 | 1.17 | dispersant |
| Ebecryl 629 | UCB Chemicals | 12.09 | 43.95 | epoxy novolac acrylate diluted with TMPTA (trimethylolpropane triacrylate) and HEMA (2-hydroxy ethyl methacrylate) |
| Elvacite 2669 | Lucite International | 8.06 | 29.30 | acrylic resin |
| Irgacure 369 | Ciba Specialty Chemicals | 0.82 | 2.97 | photoinitiator |
| Irgacure 184 | Ciba Specialty Chemicals | 0.12 | 0.44 | photoinitiator |
| 2-butanone (MEK) | | 45.31 | | |
| 1-methoxy-2-propanol acetate (PMA) | | 27.19 | | |
| Total | | 100.00 | 100.00 | |

TABLE 2

Interlayer (IL) Formulation

| Trade Name | Supplier | wt % | wt % of non-volatiles | Comments |
| --- | --- | --- | --- | --- |
| Butvar B-98 | Solutia | 0.93 | 4.64 | polyvinyl butyral resin |
| Joncryl 67 | Johnson Polymer | 2.78 | 13.92 | modified styrene acrylic polymer |
| SR351HP | Sartomer | 14.85 | 74.24 | trimethylolpropane triacrylate |
| Irgacure 369 | Ciba Specialty Chemicals | 1.25 | 6.27 | photoinitiator |
| Irgacure 184 | Ciba Specialty Chemicals | 0.19 | 0.93 | photoinitiator |
| 1-methoxy-2-propanol (PM) | | 32.00 | | solvent |
| 2-butanone (MEK) | | 48.00 | | solvent |
| | | 100.00 | 100.00 | |

TABLE 3

Sample List

| Sample ID | Catalyst Type | Receptor | Comments |
| --- | --- | --- | --- |
| 1 | Pd thin film | Argon plasma treated glass | plating observed, but adhesion failure observed in plating bath |
| 2 | Pd thin film | Argon plasma treated PET film | UV curable carrier. Plating observed. |
| 3 | Pd NP | Ar plasma treated ITO | UV curable binder. Partial plating observed. |
| 4 | Pd(OAc)$_2$ | Silane treated glass | UV curable binder. Plating observed. |

The sample 1 donor element was prepared in the following manner. A donor stock film comprising both LTHC and IL as described above was vacuum coated with 100 Å of copper phthalocyanine (CuPC) using a standard thermal evaporation procedure in a Balzers vacuum chamber at a background pressure of $10^{-7}$ Torr. The donor was then coated with 10 Å of palladium metal at a rate of 2 Å/sec using an e-beam deposition system. The CuPC was then overcoated with a solution of 5 wt % polystyrene (MW 50K, Polysciences Inc., Warrington, Pa.)/poly(styrene-co-methyl methacrylate) (Aldrich, Milwaukee, Wis.) in toluene using a #3 Mayer rod in order to achieve a dry thickness of approximately 200 nm. The donor was then baked at 100° C. for 10 minutes in a nitrogen purged oven.

The sample 2 donor element was prepared in the following manner. A donor stock film comprising both LTHC and IL as described above was vacuum coated with 100 Å of copper phthalocyanine (CuPC) using a standard thermal evaporation procedure in a Balzers vacuum chamber at a background pressure of $10^{-7}$ Torr. The donor was then coated with 10 Å of palladium metal at a rate of 2 Å/sec. The custom built e-beam deposition system was made by Kurt Lesker, Inc. The CuPC was then overcoated with a solution with a UV curable solution (Table 5) using a #3 Mayer rod in order to achieve a dry thickness of approximately 200 nm. The donor was then baked at 100° C. for 10 minutes in a nitrogen purged oven.

TABLE 5

UV Curable Polymer Solution:

| Trade Name | Supplier | Wt % solution | Wt % solids |
|---|---|---|---|
| Elvacite 4026 | Lucite International | 37.74 | 4.62 |
| Sartomer SR351HP | Sartomer | 42.45 | 5.20 |
| Sartomer CN975 | Sartomer | 14.15 | 1.73 |
| Irgacure 369 | Ciba Specialty Chemicals | 5.66 | 0.69 |
| 2-Butanone (MEK) | | | 87.76 |
| | | 100 | 100 |

After the sample was imaged, as discussed below, the imaged sample was baked at 100° C. for 10 minutes in a nitrogen purged oven then cured using a Light Hammer UV curing system from Fusion UV Systems Inc. The sample was exposed four times to UV irradiation by passage under a D bulb at 100% power at 20 ft/min.

The sample 3 donor element was prepared in the following manner. A donor stock film comprising both LTHC and Interlayer and described above was coated with a UV curable polymer binder (Table 6) containing palladium nanoparticles.

TABLE 6

UV Curable Polymer Solution with Palladium Nanoparticles

| Trade Name | Supplier | Wt % solution | Wt % solids |
|---|---|---|---|
| Elvacite 4026 | Lucite International | 33.90 | 4.56 |
| Sartomer SR351HP | Sartomer | 38.14 | 5.13 |
| Sartomer CN975 | Sartomer | 12.71 | 1.71 |
| Irgacure 369 | Ciba Specialty Chemicals | 5.08 | 0.68 |
| Pd NP | Johnson Matthey | 10.17 | 1.37 |
| 2-Butanone (MEK) | | | 86.56 |
| | | 100 | 100 |

The solution was coated using a #3 Mayer Rod to give an approximately dry thickness of 200 nm. The donor was then baked at 100° C. for 10 minutes in a nitrogen purged oven.

After the sample was imaged, as discussed below, the imaged sample was baked at 200° C. for 20 minutes in a nitrogen purged oven then cured using a Light Hammer UV curing system from Fusion UV Systems Inc. The sample was exposed four times to UV irradiation by passage under a D bulb at 100% power at 10 ft/min. The imaged sample was then Ar plasma treated at 100 W power for 1 minute to expose the Pd nanoparticles.

The sample 4 donor element was prepared in the following manner. A donor stock film comprising both LTHC and Interlayer and described above was coated with a UV curable polymer binder (Table 7) containing palladium acetate. The solution was coated using a #3 Mayer Rod to give an approximately dry thickness of 200 nm. The donor was then baked at 100° C. for 10 minutes in a nitrogen purged oven.

TABLE 7

UV Curable Polymer Solution with Palladium Acetate

| Trade Name | Supplier | Wt % solution | Wt % solids |
|---|---|---|---|
| Elvacite 4026 | Lucite International | 33.90 | 4.56 |
| Sartomer SR351HP | Sartomer | 38.14 | 5.13 |
| Sartomer CN975 | Sartomer | 12.71 | 1.71 |
| Irgacure 369 | Ciba Specialty Chemicals | 5.08 | 0.68 |
| Pd Acetate | Alfa Aesar | 10.17 | 1.37 |
| 2-Butanone (MEK) | | | 86.56 |
| | | 100 | 100 |

After the sample was imaged, as discussed below, the imaged sample was baked at 200° C. for 20 minutes in a nitrogen purged oven then cured using a Light Hammer UV curing system from Fusion UV Systems Inc. The sample was exposed four times to UV irradiation by passage under a D bulb at 100% power at 10 ft/min.

Sample number 1 was laminated onto a piece of 0.7 mm thick glass substrate that had been surface treated with Argon plasma from Plasma Science. The Argon plasma treatment was done at 100 W power for 1 minute. Laser imaging was performed by exposing the donor film in a laser imaging system based on a single-mode Nd:YAG laser with a power of 1 watt at the film plane. The laser beam was scanned across the substrate using a system of linear galvanometers, with the laser beam focused onto the image plane using an f-theta scan lens as part of a near-telecentric configuration. The laser spot size, measured at $1/e^2$ intensity was 18×250 microns. The beam was scanned unidirectionally with a triangle dither pattern oscillating at a frequency of 400 KHz. Nominal linewidth was set to 110 microns with a pitch of 165 microns.

Sample numbers 2, 3, and 4 were laminated onto a piece of 0.7 mm thick glass substrate or in case of sample 2, a piece of PET film that had been surface treated with Argon plasma from Plasma Science. The Argon plasma treatment was done at 100 W power for 1 minute. Laser imaging was performed by exposing the donor film to a mask based imaging system with a laser operating at 808 nm continuous wave mode. The laser spot size was 100×100 microns. Nominal linewidth was set to 100 microns with a pitch of 165 microns.

After the samples were imaged, they were each separately submerged in an electroless plating bath (Table 8). The plating bath solution was prepared in the following manner. Copper, tartrate and sodium hydroxide were dissolved in 1 L of distilled water. Formaldehyde was added last and the plating solution was heated to 55° C. The samples were submerged for up to 20 minutes and plating of copper was observed in the imaged areas.

TABLE 8

| Electroless Plating Solution: | | |
| --- | --- | --- |
| Trade Name | Supplier | Concentration |
| Copper sulfate pentahydrate | Alfa Aesar | 5 g/L |
| Sodium potassium tartrate | Fisher Scientific | 25 g/L |
| Sodium hydroxide | EMD | 7 g/L |
| Formaldehyde, 37% solution | Alfa Aesar | 10 g/L |

After sample 4 was exposed to the electroless plating bath, a micrograph of the sample was taken. The micrograph can be seen in FIG. 7.

While the disclosure has been particularly shown and described with reference to various embodiments thereof, it will be understood by those skilled in the art that various other changes in the form and details may be made therein without departing from the spirit and scope of the disclosure.

Thus, embodiments of a method of patterning a substrate are disclosed. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of forming a metallic material on a receptor comprising the steps of:
    placing a donor element proximate a receptor, wherein the donor element comprises a donor substrate and a thermal transfer layer, wherein the thermal transfer layer comprises a catalytic material, and wherein the thermal transfer layer of the donor element is placed proximate the surface of the receptor;
    transferring at least a portion of the thermal transfer layer from the donor element to the receptor, wherein the transfer is carried out using a laser;
    electrolessly depositing a metallic material on the receptor by growth of the metallic material on the catalytic material,
    wherein the catalytic material is a catalyst precursor; and
    converting the catalyst precursor to an active catalytic material,
    wherein the catalyst precursor is converted before the thermal transfer layer is thermally transferred.

2. The method according to claim 1, wherein the thermal transfer layer further comprises a polymeric binder.

3. The method according to claim 1, wherein the donor element further comprises a light-to-heat conversion layer disposed between the donor substrate and the thermal transfer layer, and an interlayer disposed between the light-to-heat conversion layer and the thermal transfer layer.

4. The method according to claim 3, wherein the donor element further comprises a release layer disposed between the interlayer and the thermal transfer layer.

5. The method according to claim 2 further comprising the step of crosslinking the polymeric binder.

6. The method according to claim 5, wherein the step of crosslinking is accomplished after the thermal transfer layer is selectively transferred from the donor element to the receptor.

7. An article comprising, in the following order:
    a receptor substrate;
    a patterned first layer, wherein the first layer is capable of adhering to the receptor substrate;
    a patterned second layer comprising a catalytic material; and
    an electrolessly deposited metallic material, wherein the metallic material has the same pattern as the patterned first layer and the patterned second layer,
    wherein the patterned first layer and the patterned second layer are thermally transferred to the receptor substrate from a donor element and would be incompatible if originally formed on the receptor substrate in the order in which they are found on the receptor substrate.

8. The article according to claim 7 wherein the first layer comprises a polymeric binder.

9. The article according to claim 8, wherein the polymeric binder comprises a polymer that is capable of being crosslinked or has been crosslinked.

10. The article according to claim 7, wherein the incompatibility of the first layer and the second layer are based on solubility.

11. The article according to claim 10, wherein the incompatibility of the first layer and the second layer are based on one or more compounds in the first layer and the second layer.

12. The article according to claim 7 further comprising a release layer positioned between the receptor substrate and the first layer.

13. The article according to claim 7, wherein the metallic material is reflective or semi-transparent.

14. The article according to claim 13, wherein the article can be utilized as a micromirror array.

* * * * *